(12) United States Patent
Catalan Lago et al.

(10) Patent No.: US 10,090,681 B2
(45) Date of Patent: Oct. 2, 2018

(54) SYNCHRONIZATION SYSTEM FOR POWER GENERATION UNIT AND METHOD THEREOF

(71) Applicant: INGETEAM POWER TECHNOLOGY, S.A., Zamudio (ES)

(72) Inventors: Pedro Catalan Lago, Zamudio (ES); Eneko Olea Oregi, Zamudio (ES); Jose Ignacio Candela Garcia, Barcelona (ES); Alvaro Luna Alloza, Barcelona (ES); Kumars Rouzbehi, Barcelona (ES)

(73) Assignee: INGETEAM POWER TECHNOLOGY, S.A., Zamudio (ES)

( * ) Notice: Subject to any disclaimer, the term of this patent is extended or adjusted under 35 U.S.C. 154(b) by 0 days.

(21) Appl. No.: 15/320,383

(22) PCT Filed: Jan. 30, 2015

(86) PCT No.: PCT/ES2015/070066
§ 371 (c)(1),
(2) Date: Dec. 20, 2016

(87) PCT Pub. No.: WO2016/120503
PCT Pub. Date: Aug. 4, 2016

(65) Prior Publication Data
US 2017/0207635 A1    Jul. 20, 2017

(51) Int. Cl.
*H03J 3/04*     (2006.01)
*H02J 3/44*     (2006.01)
(Continued)

(52) U.S. Cl.
CPC .................. *H02J 3/44* (2013.01); *H02J 3/16* (2013.01); *H02J 3/40* (2013.01); *H03L 5/00* (2013.01);
(Continued)

(58) Field of Classification Search
CPC ... H03L 7/07; H03L 7/107; H03L 7/18; H03L 1/02; H03L 7/093; H03L 7/099;
(Continued)

(56) References Cited

U.S. PATENT DOCUMENTS

2003/0222507 A1    12/2003    Deng
2008/0093853 A1    4/2008     Barker et al.
(Continued)

OTHER PUBLICATIONS

International Search Report of PCT/ES2015/070066 dated Sep. 22, 2015 [PCT/ISA/210].
(Continued)

*Primary Examiner* — John Poos
(74) *Attorney, Agent, or Firm* — Sughrue Mion, PLLC

(57) ABSTRACT

Synchronization system and method for a power generation unit coupled to an electrical power system, in order to facilitate the synchronization between the power generation unit and the electrical power system. A synchronization signal ($S_S$) is generated by means of at least one Phase-Locked Loop (4) from a main electrical signal ($S_e$) received from the electrical power system. The Phase-Locked Loop (4) comprises a controller scheme with a plurality of gain parameters ($K_{mn}$) to eliminate at least some of the deviations of the synchronization signal ($S_s$) in respect of the main electrical signal ($S_e$), and said gain parameters ($K_{mn}$) are adjusted depending on the frequency and the amplitude of said main electrical signal ($S_e$).

15 Claims, 5 Drawing Sheets

(51) Int. Cl.
  *H02J 3/40*   (2006.01)
  *H03L 7/107*  (2006.01)
  *H02J 3/16*   (2006.01)
  *H03L 7/07*   (2006.01)
  *H03L 5/00*   (2006.01)
  *H03L 7/00*   (2006.01)

(52) U.S. Cl.
  CPC ............... *H03L 7/00* (2013.01); *H03L 7/07* (2013.01); *H03L 7/107* (2013.01)

(58) Field of Classification Search
  CPC ........ H02J 3/16; H02J 3/32; H02J 3/44; H02J 3/48; H02J 3/50
  USPC ......................................... 327/156, 157, 158
  See application file for complete search history.

(56) References Cited

U.S. PATENT DOCUMENTS

| | | |
|---|---|---|
| 2011/0128054 A1 | 6/2011 | Kerkman et al. |
| 2011/0148489 A1 | 6/2011 | August et al. |
| 2012/0133403 A1* | 5/2012 | Miyanaga ............... H03L 7/083 327/156 |
| 2014/0043080 A1 | 2/2014 | Larsen |

OTHER PUBLICATIONS

Written Opinion of PCT/ES2015/070066 dated Sep. 22, 2015 [PCT/ISA/237].

\* cited by examiner

SYNCHRONIZATION SYSTEM FOR POWER GENERATION UNIT AND METHOD THEREOF

CROSS REFERENCE TO RELATED APPLICATIONS

This application is a National Stage of International Application No. PCT/ES2015/070066, filed Jan. 30, 2015, the contents of which are incorporated herein by reference in its entirety.

TECHNICAL FIELD

The present invention relates to electrical power generation applications, and more particularly to synchronization systems for facilitating the synchronization between an electrical power generation unit and an electrical power system (a grid), based on a Phase-Locked Loop (PLL) concept.

PRIOR ART

The latest interest in synchronization systems within the field of electrical power systems has arisen in the last years, where several power generation technologies became forced to provide transient grid support functionalities within a narrow time response window.

The first synchronization solutions applied to the field of power generation applications are based on simple Synchronous Reference Frame Phase-Locked Loop (SRF-PLL) systems. The performance of such SRF-PLLs is adequate under steady state and balanced conditions of the grid, being its performance is quite deficient under unbalanced or distorted conditions of the grid.

In order to solve the main drawbacks of the SRF-PLL, different synchronization structures based on adding improvements to the SRF-PLL are also known. Some of these structures propose some changes in the measured variables' pre-processing with the integration of a simple Quadrature Signal Generation (QSG) block, in order to obtain a real quadrature signal, and others, with the integration of an advanced QSG block which includes a filtering stage that improves the harmonic immunity of the PLL. Almost all these advanced SRF-PLLs are also frequency adaptive, permitting thus to get a good synchronization even under frequency variations.

Although most of the applications are oriented to the estimation of the fundamental components, others are also proposed for detecting the amplitude of different harmonics components, by means of cascading different building blocks. The performance of these multi-stage PLLs is shown to be effective when the synchronization signal is highly polluted, as the estimated harmonic components can be subtracted from the input signal, improving thus the synchronization at the fundamental frequency.

Under fault conditions, PPL based grid synchronization systems should cope with sudden changes in the phase angle that appear due to the line impedance change produced by the fault. As the phase of an electrical signal is a parameter which is likely to be suddenly changed all these structures should deal with relatively big transients, affecting thus to the stabilization time. In this regard, solutions based on Frequency-Locked Loops (FLL), instead of the phase, are also known.

The operation range of a PLL or a FLL normally covers a wide operation range that varies from zero to a nominal value. However, the tuning of controllers usually is performed considering the vicinity of a certain operation point. Thus, the overall performance can be quite different if the input signal is the nominal value or half the nominal value. The latest improvements within the field of synchronization systems for power generation applications have been focused on improving this drawback, by using normalized systems able to provide the same time performance no matter which the grid conditions are. This normalization is mainly focused on improving the response of the system when coping with amplitude variations of the electrical signal.

Although many solutions have covered the normalization of the amplitude, just a few are able to guarantee the delivery of a phase reference under total absence of input signal. For this particular scenario there are known some solutions which are normally based on the implementation of discrete state-machines that control the behavior of the PLL, and which are able to make the PLL act as an oscillator to provide a reference phase to the controllers based on the pre-fault conditions. One of these solutions is discloses in the document US2008093853A1.

DISCLOSURE OF THE INVENTION

One object is to provide a synchronization system and a synchronization method for a power generation unit coupled to an electrical power system, as described in the claims.

Some embodiments refer to a synchronization system for a power generation unit coupled to an electrical power system. The system is configured to be communicated with the electrical power system and with the power generation unit (a grid), and to facilitate the synchronization between the power generation unit and the electrical power system. The synchronization system is also configured to receive at least one main electrical signal from the electrical power system, and to generate, based on said main electrical signal, at least one synchronization signal for facilitating said synchronization by means of at least one Phase-Locked Loop.

The Phase-Locked Loop comprises at least one controller scheme with a plurality of gain parameters, to eliminate the deviation of at least one electrical property of the generated synchronization signal with respect to the main electrical signal, the electrical property being selected between at least the amplitude, the frequency and the phase angle.

The synchronization system also comprises a gain controller configured to adjust the value of the gain parameters of the Phase-Locked Loop, depending on the frequency or the phase angle and the amplitude of the main electrical signal. Therefore, said gain parameters can be adjusted dynamically following possible changes in the main electrical signal, and consequently the generation of the synchronization signal is based on the current conditions of the electrical power system, the synchronization between the power generation unit and the electrical power system being improved.

In addition, the fact of using both the amplitude and the frequency (or the phase angle) of the main electrical signal to adjust the gain parameters allows taking into account the changes in the main electrical signal more quickly, a more dynamic synchronization system being obtained. Hence, the behavior of the proposed systems is especially advantageous under transients and faulty scenarios, where the performance of other controllers included in the power generation unit depends upon the fast and accurate dynamical response of the synchronization system.

Other embodiments refer to a synchronization method for a power generation unit coupled to an electrical power system, wherein at least one synchronization signal is generated for facilitating the synchronization between the power generation unit and the power system by means of at least one Phase-Locked Loop. The Phase-Locked Loop comprises at least one controller scheme with a plurality of gain parameters, to eliminate the deviation of at least one electrical property of the synchronization signal in respect of the main electrical signal, the electrical property being selected between at least the amplitude, the frequency and the phase angle. The value of the gain parameters of the Phase-Locked Loop are dynamically adjusted depending on the frequency, or phase angle, and the amplitude of the main electrical signal.

Therefore, a synchronization signal which accurately and dynamically represents the behavior of the main electrical signal is generated in an easy way, which can be used to synchronize the power generation unit and the electrical power system. In addition, the behavior of the proposed methods are especially advantageous under transients and faulty scenarios, as it allows a fast and accurate dynamical generation of the synchronization signal.

These and other advantages and features of the invention will become evident in view of the drawings and the detailed description of the invention.

DETAILED DISCLOSURE OF THE INVENTION

Figure 1:
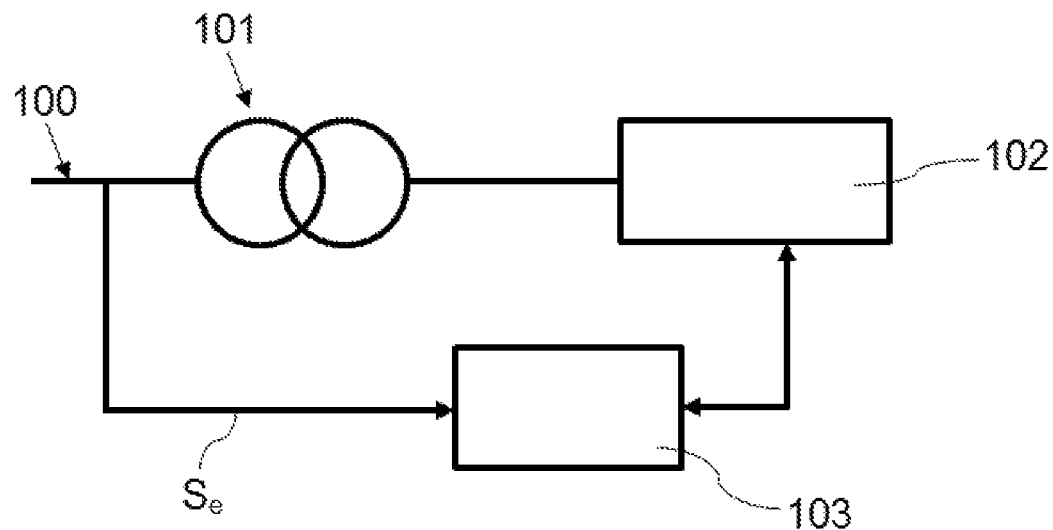
FIG. 1 shows an embodiment of the synchronization system of the invention communicated with a power generation unit and with an electrical power system (a grid).

Some embodiments refer to a synchronization system 103 for a power generation unit 102 coupled to an electrical power system 100 (a grid 100). In some embodiments the generation unit 102 comprises at least one power converter and a controller for acting upon the power converter (not shown in Figures), the synchronization system 103 being integrated into said controller. In other embodiments, the power generation unit 102 comprises at least one power converter and a controller for acting upon the power converter (not shown in Figures), the synchronization system 103 being another controller communicated with said controller. In other embodiments, the power generation unit 102 comprises at least one power converter and the controller for acting upon said power converter and the synchronization system 103 are integrated in the same controller. For the sake of clarity, in FIG. 1 the synchronization system 103 is shown as being independent from the power generation unit 102, and the synchronization system 103 can be integrated in the controller of the at least one power converter of the power generation unit 102 or in the power generation unit 102. Therefore, when it is indicated that the synchronization system 103 is configured to be communicated with the grid 100 and with the power generation unit 102, it must be understood that the synchronization system 103 can be integrated in the controller for acting upon the power converter of the power generation unit 102 or in the power generation unit 102.

Figure 2:
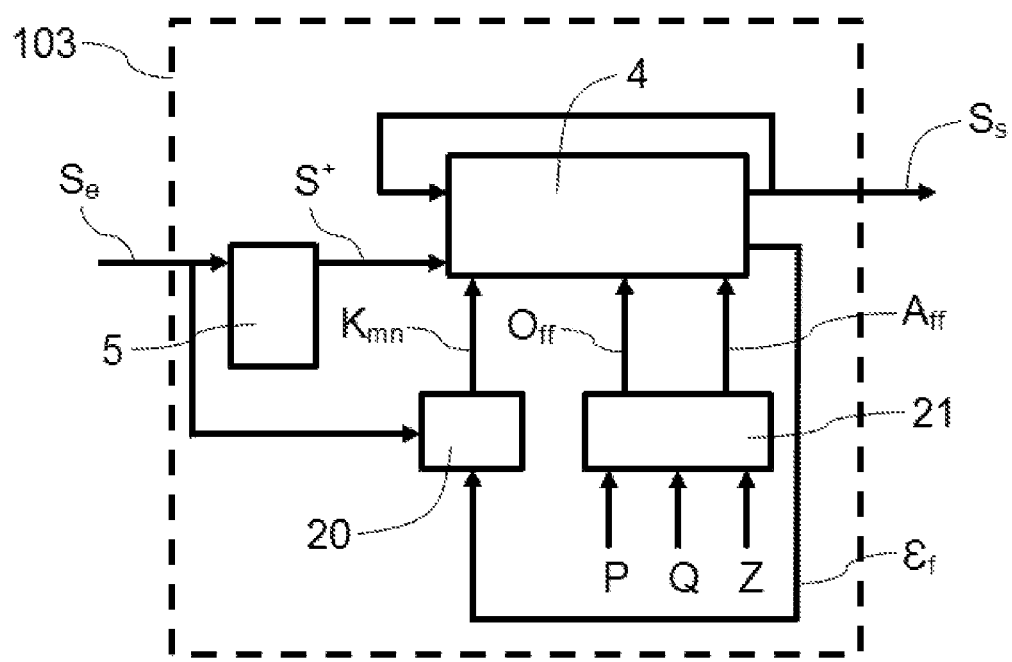
FIG. 2 shows a general structure of an embodiment of a synchronization system.

The synchronization system 103 is configured to be communicated with the grid 100 and with the power generation unit 102 and to facilitate the synchronization between the power generation unit 102 and the grid 100. FIG. 2 shows the general structure of a preferred embodiment of the synchronization system 103 of the invention, which is based on a Phase-Locked Loop concept. The wording "Phase-Locked Loop" is commonly known also as PLL, and it is so referred to hereinafter. The power generation unit 102 can be directly coupled to the grid 100 or through a transformer 101 as shown in said FIG. 1.

In the preferred embodiment, the synchronization system 103 is adapted to be communicated with a three-phase electrical power system, but in other embodiments, not shown in the Figures, said synchronization system 103 could be adapted to be communicated with a single-phase electrical power system.

The synchronization system 103, in any of its embodiments, is configured to receive at least one main electrical signal $S_e$ from the grid 100. The main electrical signal $S_e$ may be any of the electrical variables of the corresponding phase, such as the voltage or the current. If the grid 100 is a three-phase power system the main electrical signal $S_e$ can derive from any of the three-phases. If the grid 100 is a single-phase power system the main electrical signal $S_e$ derives, obviously, from the only phase.

In any of its embodiments the synchronization system 103 is configured to generate, based on the main electrical signal $S_e$, at least one synchronization signal $S_s$ for facilitating the synchronization between the power generation unit 102 and the grid 100. The synchronization signal $S_s$ is a control signal that contains the information of the electrical signal $S_e$. The synchronization system 103 comprises at least one PLL 4 to generate the synchronization signal $S_s$ and a gain controller 20 in communication with the PLL 4. The PLL 4 comprises at least one controller scheme with a plurality of gain parameters $K_{mn}$, to eliminate the deviation of at least one electrical property of the generated synchronization signal $S_s$ with respect to the main electrical signal $S_e$, the electrical property being selected between, at least, the amplitude, the frequency and the phase angle. The gain controller 20 adjusts the value of the gain parameters $K_{mn}$ of the controller scheme of the PLL 4 depending on the frequency (or the phase angle) and the amplitude of the main electrical signal $S_e$. As the gain controller 20 transmits the adjusted values of the gain parameters $K_{mn}$ to the PLL 4, the synchronization signal $S_s$ is continuously generated by said PLL 4 according to said adjusted gain parameters $K_{mn}$.

The synchronization system 103 remains active at all times, both during steady state and transient conditions such as voltage drops, overvoltages, or frequency variations, it being able to remain active and adapt its dynamics through the variation of $K_{mn}$ parameters to facilitate an accurate synchronization between the grid 100 and the power generation unit 102.

In a preferred embodiment, the gain controller 20 is configured to estimate the amplitude and the frequency of the main electrical signal $S_e$, and to adjust the value of the gain parameters $K_{mn}$ of the PLL 4 depending on said estimated amplitude and frequency. In other embodiments, the gain controller 20 is configured to estimate at least the amplitude of the main electrical signal $S_e$, and to receive the frequency of the main electrical signal $S_e$ or a frequency difference $\varepsilon_f$ between the frequency of the main electrical signal $S_e$ and a predetermined reference frequency for the grid 100, and to adjust the value of the gain parameters $K_{mn}$ of the PLL 4 depending on the received frequency or frequency difference $\varepsilon_f$ and the estimated amplitude. The predetermined reference frequency can be 50 Hz for example, which is a normal frequency value of a grid 100. The frequency error $\varepsilon_f$ could be estimated by the PLL 4 for example. In order to improve the dynamic response, in any of the embodiments the amplitude is preferably estimated with a known Mann—Morrison technique.

Figure 3:
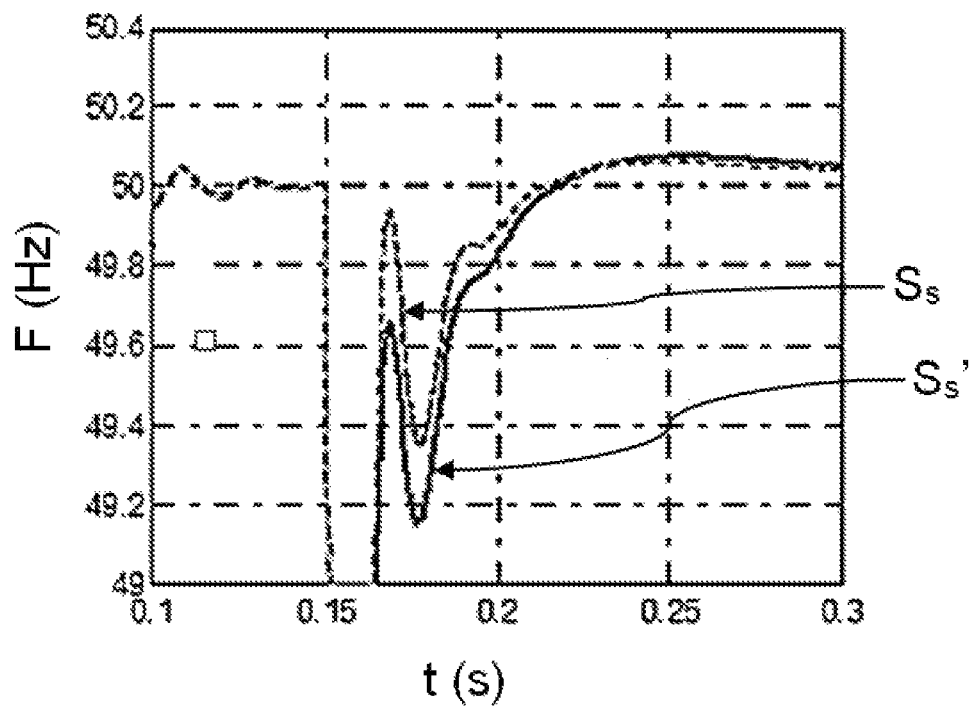
FIG. 3 shows a comparison between the frequency of a synchronization signal generated without and with the gain controller of the synchronization system of FIG. 2.

The use of both the amplitude and the frequency (or the phase angle) of the main electrical signal $S_e$ to adjust the gain parameters $K_{mn}$ allows taking into account the changes in the main electrical signal $S_e$ more quickly, a more dynamic synchronization system 103 being obtained. FIG. 3 shows, in a predetermined time t interval, a comparison between the frequency F of the generated synchronization signal $S_s'$ with the gain controller 20 that uses one input (the amplitude in this case), and the frequency F of the generated synchronization signal $S_s$ with the gain controller 20 of the synchronization system 103, which uses two inputs (the amplitude and the frequency), when a sudden change in the frequency of the main electric signal $S_e$ occurs. Both synchronization signals $S_s'$ and $S_s$ have been obtained for the same conditions of the main electrical signal $S_e$ and before the same change in the frequency of the main electric signal $S_e$. As it can be seen, by using both inputs for the gain controller 20 the dynamic performance in the estimation of the frequency is improved.

When it is referred that the gain parameters $K_{mn}$ are adjusted depending at least on the frequency or the frequency error $\varepsilon_f$ it has to be noted that the phase angle or the phase angle error could be used instead. For the sake of clarity, frequency or frequency error $\varepsilon_f$ is referred to hereinafter.

In a preferred embodiment, in order to improve the synchronization loop of the PLL 4, and in particular the performance of the PLL 4, during grid transients, the gain controller 20 is configured to apply fuzzy logic to adjust the gain parameters $K_{mn}$ of the PLL 4 based on the estimated amplitude of the main electrical signal $S_e$ and on the frequency difference $\varepsilon_f$ (the frequency could also be used instead). Applying fuzzy logic allows the gain controller 20 to accurately adjust the gain parameters $K_{mn}$ according to the current conditions of the main electric signal $S_e$, obtaining a more robust and reliable system, which follows more accurately the real conditions of the grid 100. In particular, using said two input parameters (amplitude and frequency difference $\varepsilon_f$ or frequency), the gain controller 20 provides a more reliable response in front of transients that involve sudden variations of the main electrical signal $S_e$ as well as rapid changes in the phase angle. Thus, the synchronization system 103 is capable of generating, dynamically, a synchronization signal $S_s$ that accurately represents the behavior of the main electrical signal $S_e$ in order to synchronize the power generation unit 102 and the grid 100.

Figure 4:
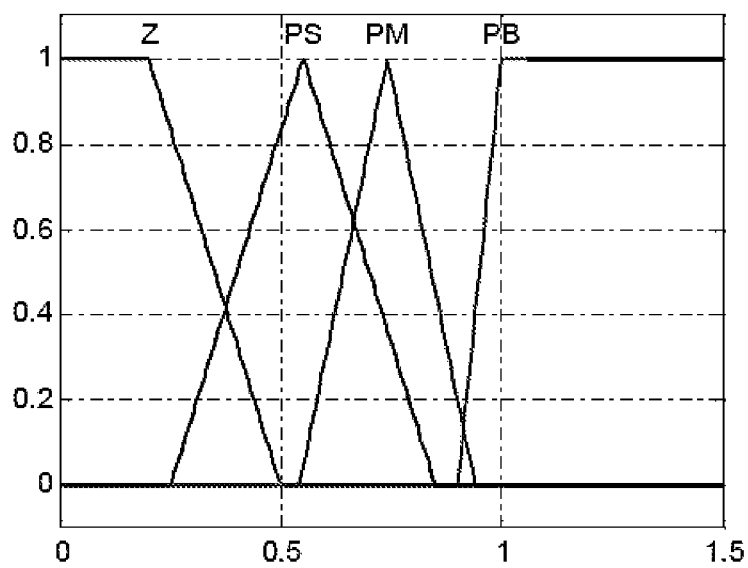
FIG. 4 shows an implementation of a gain parameter using fuzzy logic.

Fuzzy logic is a form of many-valued logic (amplitude and frequency difference $\varepsilon_f$ or frequency in this case), and as it is well-known in the field, it is not described in detail. For applying the fuzzy logic control a certain number of rules are established that determine the dynamic response of the PLL 4, said rules being established according to the experience about the synchronization system 103 behavior (expert control). In the synchronization system 103 of the invention, and as illustrated in FIG. 4, a plurality of ranges Z (zero), PS (positive small), PM (positive medium) and PB (positive big) are established depending on the inputs of the fuzzy logic control (amplitude and frequency error $\varepsilon_f$ or frequency of the main electrical signal $S_e$) in order to adjust of the gain parameters $K_{mn}$.

In a preferred embodiment, the PLL 4 is configured to receive an electrical input signal based on the main electrical signal $S_e$, said electrical input signal comprising the same amplitude, frequency and phase angle of the main electrical signal $S_e$, and whose generation will be explained later. In other embodiments the PLL 4 could be configured to receive the main electrical signal $S_e$ directly.

Figure 5:
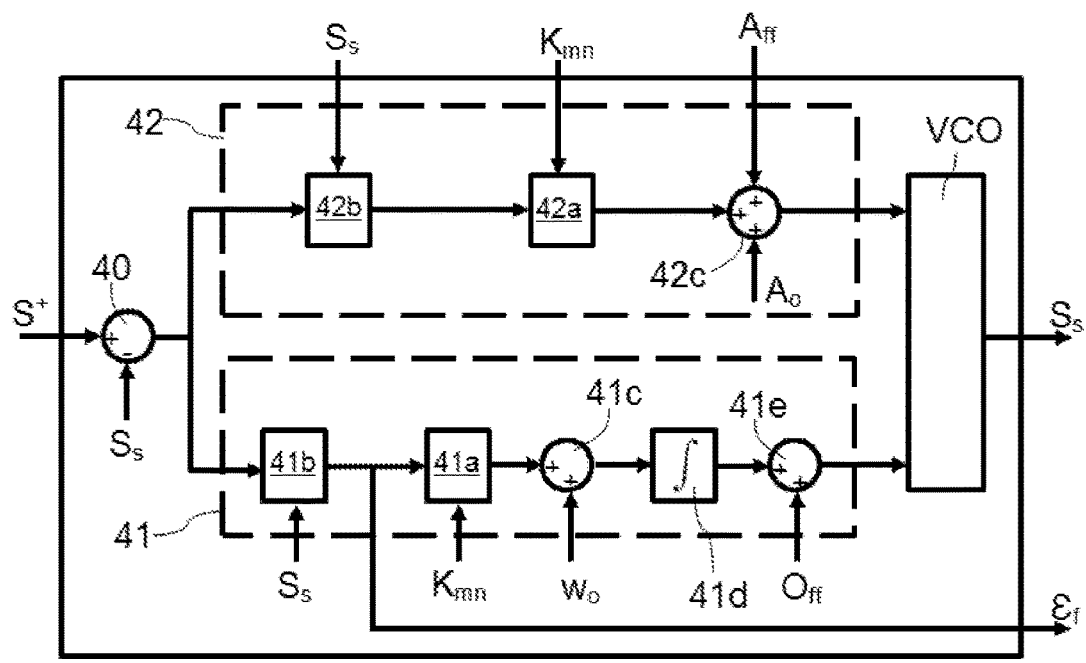
FIG. 5 shows schematically the internal structure of the Phase-Locked Loop of the synchronization system of FIG. 2.

The controller scheme of the PLL 4 is configured to eliminate the deviation of at least one electrical property of the synchronization signal $S_s$ with respect to the main electrical signal $S_e$, the electrical property being selected between, at least, the amplitude, the frequency and the phase angle. Therefore, as shown in FIG. 5, the PLL 4 comprises an input block 40 where a subtraction between the electrical input signal and the synchronization signal $S_s$ is made, the electrical signal (electrical error signal) resulting from said subtraction reaching the controller scheme in order to eliminate said deviation.

In the preferred embodiment, the controller scheme of the PLL 4 comprises two control loops 41 and 42 in parallel. The first control loop 41 is in charge of eliminating a phase angle error between the synchronization signal $S_s$ and the electrical input signal (the deviation between the phase angles of the synchronization signal $S_s$ and the electrical input signal, and thus, the deviation between the phase angles of the synchronization signal $S_s$ and the main electrical signal $S_e$), and the second control loop 42 is in charge of eliminating an amplitude error between the synchronization signal $S_s$ and the electrical input signal (the deviation between the amplitude of the synchronization signal $S_s$ and the electrical input signal, and thus, the deviation between the amplitude of the synchronization signal $S_s$ and the main electrical signal $S_e$). The output signals of both control loops 41 and 42 are combined by means of an oscillator VCO, the output of said oscillator VCO being the synchronization signal $S_s$.

Each control loop 41 and 42 comprises at least one controller 41a and 42a with a plurality of corresponding gain parameters $K_{mn}$ each. In the preferred embodiment each controller 41a and 42a comprises a PI controller with the corresponding plurality of gain parameters $K_{mn}$ (respective proportional and integral gains), but in other embodiments each controller 41a and 42a can comprise other kinds of controller configurations such as a PID controller for example. Therefore, if a PI controller is referred hereinafter, it must be understood that other kinds of controllers could also be used unless another point is expressly indicated.

The PLLs known from the prior art use only one control loop (the control loop 41 in charge of eliminating the phase angle error), and thanks also to the use of the second control loop 42, the synchronization signal $S_s$ generated with the synchronization system 103 represents more accurately the behavior of the grid 100, and, thus, the synchronization between the power generation unit 102 and the grid 100 is improved.

In addition to the controller 41a, in the preferred embodiment the first control loop 41 also comprises the following elements: a first block 41b, a second block 41c, and an integral block 41d. The first block 41b receives the electrical error signal and makes the vector product of it with the synchronization signal $S_s$, the resulting signal constituting the phase angle error, and, hence, a variation in the frequency of the synchronization signal $S_s$ must be caused if said error differs from zero in order to synchronize the electrical input signal and the synchronization signal $S_s$, and thus the grid 100 and the power generation unit 102. A linear controller 41a is used for cancelling out the steady state error (a PI controller in a preferred embodiment, although other known controllers such as PID controllers could be used), said error reaching the controller 41a. In the second block 41c the nominal frequency $w_o$ is used as a feed forward, it being added to the signal outputting the controller 41a. The signal outputting the second block 41c reaches the integral block 41d it being integrated therein, as the integral of the frequency represents the value of the phase angle. Therefore, the phase angle of the electrical signal outputting the integral block 41d comprises the same phase angle as the electrical input signal and it is used to generate the synchronization signal $S_s$.

In addition to the controller 42a, in the preferred embodiment the second control loop 42 also comprises the following elements: a first block 42b and a second block 42c. The first block 42b receives the electrical error signal and makes the dot product of said signal with the synchronization signal $S_s$. The output of the dot product is the error in the amplitude value, which can be cancelled with a linear controller 42a (a PI controller in the preferred embodiment, although other known controllers such as PID controllers could be used). Thus, the signal outputting the first block 42b reaches the controller. The signal outputting the controller reaches the second block 42c, and said second block 42c adds the nominal amplitude $A_o$ of the corresponding measured signal (electrical voltage or electrical current) of the electrical input signal to the signal received from the controller. The signal outputting the second block 42c represents the amplitude for the synchronization signal $S_s$, and therefore it is used to generate said synchronization signal $S_s$. The estimated values of the amplitude and the phase angle obtained in the two control loops 41 and 42 feed the oscillator VCO, which generates a single-phase or three-phase 120° shifted signal (the synchronization signal $S_s$).

In the preferred embodiment the synchronization system 103 also comprises an advanced estimator 21 in communication with the PLL 4, in particular with both control loops 41 and 42. The advanced estimator 21 is configured to receive a first power-related signal P and a second power-related signal Q representative of the active and reactive power of the grid 100 respectively, to estimate the phase angle that would have the main electrical signal $S_e$ depending on the power-related signals P and Q and on a grid impedance Z, to calculate the phase angle of the main electrical signal $S_e$, and to obtain a phase angle difference $O_{ff}$ between both the estimated and calculated phase angles. The phase angle difference $O_{ff}$ is transmitted to the control loop 41, so that the PLL 4 also takes into account said phase angle difference $O_{ff}$ to generate the synchronization signal $S_s$. In particular, the phase angle difference $O_{ff}$ is added, in a third block 41e, as feed forward to the signal output from the integral block 41d of the control loop 41. The advance estimator 21 therefore allows counteracting and anticipating sudden changes in the phase angle of a phase of the grid 100. This is especially useful in weak grids 100, where the value of the impedance Z is high and the changes in active/reactive power delivery/consumption give rise to relevant changes in the main electrical signal $S_e$. By means of the advance estimator 21 said changes are previously or on-line calculated, and later provided to the PLL 4 as feed forward for the phase angle. The grid impedance Z does not need to be the exact value, just a reasonable approximation.

In the preferred embodiment the advanced estimator 21 is also configured to estimate an amplitude difference $A_{ff}$ between the amplitude corresponding to the situation depending on the received power-related signals P and Q and on the grid impedance Z and the estimated amplitude of said electrical input signal, and to transmit the estimated amplitude difference $A_{ff}$ as feed forward to the second additional control loop 42, so that the PLL 4 also takes into account said amplitude difference $A_{ff}$ to generate the synchronization signal $S_S$. In particular, the amplitude difference $A_{ff}$ is added, also, to the signal output from the controller of the second control loop 42. The use of the advance estimator 21 also improves the transient response of the synchronization system 103 under sudden changes in amplitude of the electrical input signal caused by power changes, since said power changes can be taken into account before being included in the electrical input signal.

In other embodiments the PLL 4 comprises only one control loop, in particular the control loop 41, and the synchronization system 103 comprises also the advanced estimator 21 for providing the phase angle difference $O_{ff}$ to said control loop 41.

In other embodiments the PLL 4 comprises only one control loop, in particular the control loop 41, and the synchronization system 103 lacks the advanced estimator 21.

In other embodiments the PLL 4 comprises the two control loops 41 and 42, and the synchronization system 103 lacks the advanced estimator 21.

The power-related signals P and Q are representative, respectively, of the active and reactive power to be delivered to the grid 100 (or set points) or of the active and reactive power delivered to the grid 100.

In some embodiments, as in the preferred embodiment, the synchronization system 103 also comprises a processing block 5 configured to receive the main electrical signal $S_e$ and to process it in order to obtain an estimation of at least one of the instantaneous symmetrical components (positive sequence $S^+$ and negative sequence $S^-$) of the main electrical signal $S_e$. One of the positive sequence $S^+$ or the negative sequence $S^-$ is the signal received by the PLL 4, said signal thus being the electrical input signal based on the main electrical signal $S_e$. The processing block 5 can estimate both a positive sequence $S^+$ and a negative sequence $S^-$, as the processing block 5 shown by way of example in FIG. 6, only the negative sequence $S^-$, or only the positive sequence $S^+$ as in the preferred embodiment. Therefore, in the preferred embodiment, as shown in FIG. 5, the electrical input signal based on the main electrical signal $S_e$ which reaches the PLL 4 is the positive sequence $S^+$.

Figure 6:
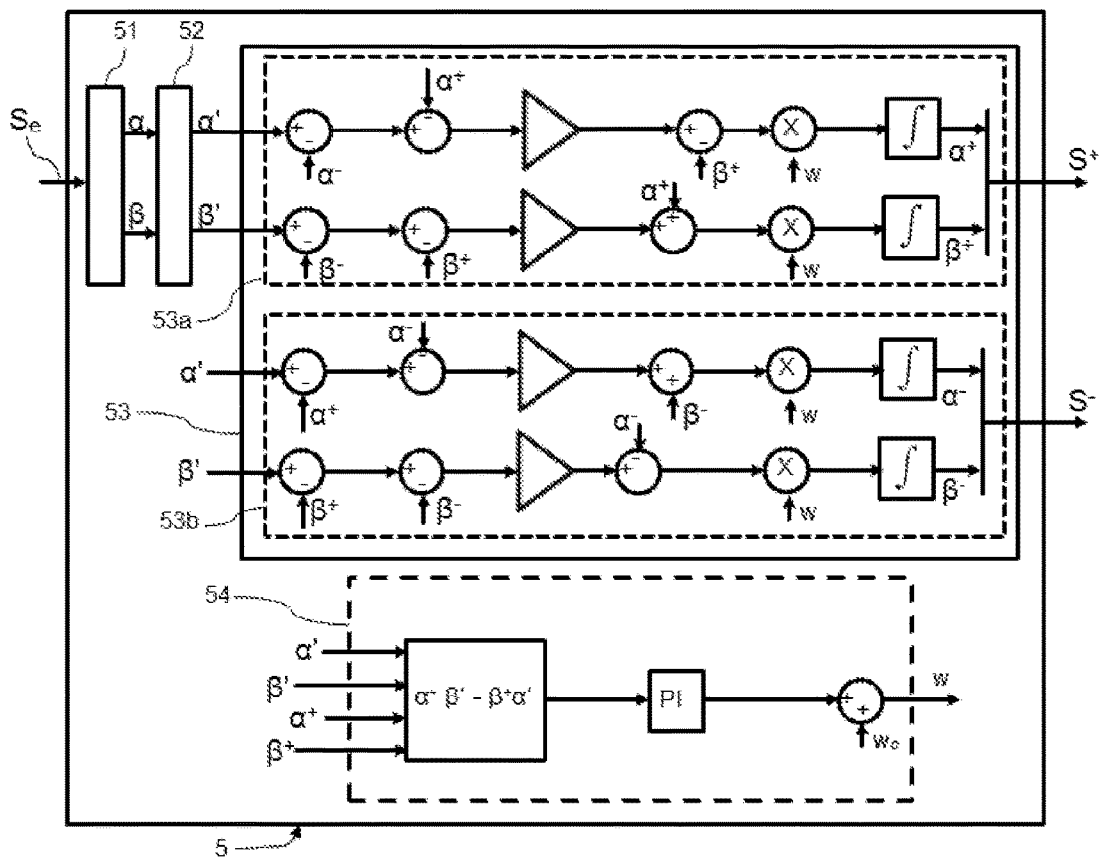
FIG. 6 shows schematically the internal structure of the processing block of the synchronization system of FIG. 2.

The structure of the processing block 5 can be divided into two main blocks as shown in FIG. 6, a first processing block 53 for obtaining the negative sequence $S^-$ and/or the positive sequence $S^+$ of the main electrical signal $S_e$ (the positive sequence $S^+$ in the preferred embodiment), and a second block 54 for estimating the frequency w of the main electrical signal $S_e$. The first processing block 53 comprises a first sequence estimator 53a that obtains the positive sequence S⁺ and/or a second sequence estimator 53b that obtains the negative sequence S⁻ of the main electrical signal $S_e$ in case of a three-phase power systems. In case of single phase systems, the processing block 5 could be simplified and already known techniques could be used, such us the T/4 transport delay technique already known in the field, since no asymmetry is possible and thus there is no need of positive and negative sequence calculation.

The processing block 5 comprises a transforming block 51 to transform the main electrical signal $S_e$ into an alpha-beta (αβ) components, and a high pass filter 52 for cancelling out the effects of possible DC components present in the alpha-beta components, said filtered alpha-beta components reaching the two main blocks. As stated before, FIG. 6 shows an example of the structure of the processing block 5, which can be equal to the structure of the processing block 5 of the preferred embodiment with the difference that in the preferred embodiment the negative sequence S⁻ is not obtained.

Three different scenarios, extracted from typical faulty scenarios, are now presented by way of example, to illustrate the invention.

Figure 7:
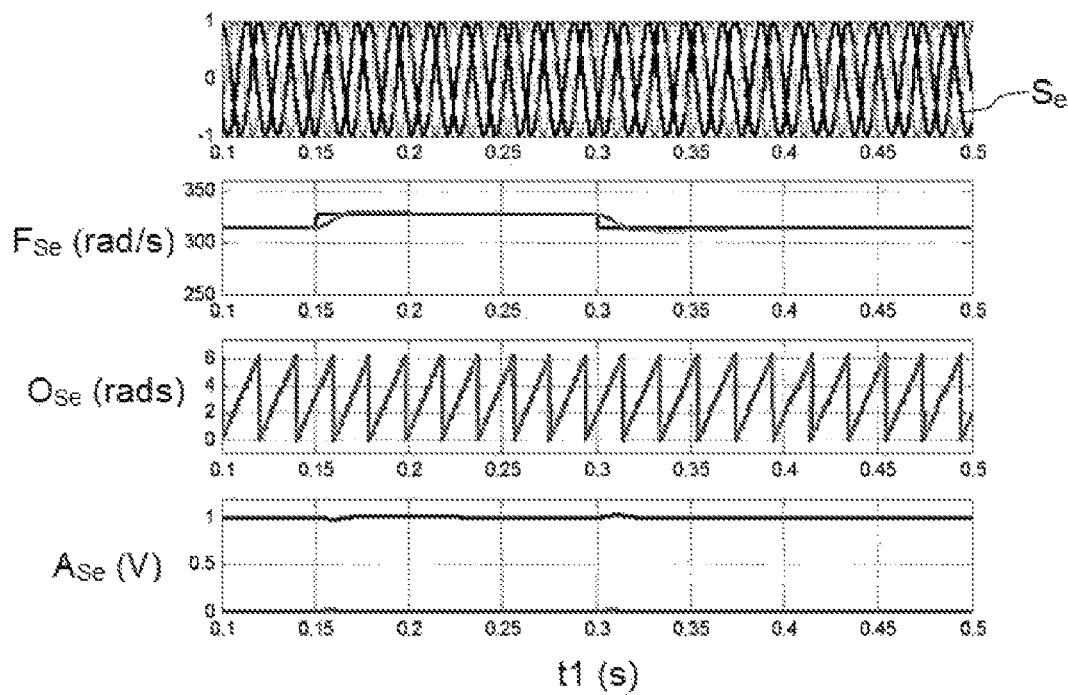
FIG. 7 shows the performance of the synchronization system of FIG. 2 under a sudden change in the frequency of the main electrical signal.

FIG. 7 shows the performance of the proposed synchronization system 103, in a predetermined interval of time t1, for frequency $F_{Se}$ estimation, phase angle $O_{Se}$ and amplitude $A_{Se}$ of a main electrical signal $S_e$ of a three-phase power system by said synchronization system 103, under a sudden change in the frequency of said main electrical signal $S_e$ at t=0.15 s and t=0.3 s. The main electrical signal $S_e$ is the voltage of a phase off the power system 100. Said FIG. 7 is divided into four plots: (a) Measured main electrical signal $S_e$, (b) Real frequency $F_R$ and estimated frequency $F_S$ of the main electrical signal $S_e$, (c) Real phase angle $O_R$ and estimated phase angle $O_S$ of the main electrical signal $S_e$, and (d) Estimated amplitude $A_S$ of the positive sequence S⁺ and/or the negative sequence S⁻ of said main electrical signal $S_e$.

Figure 8:
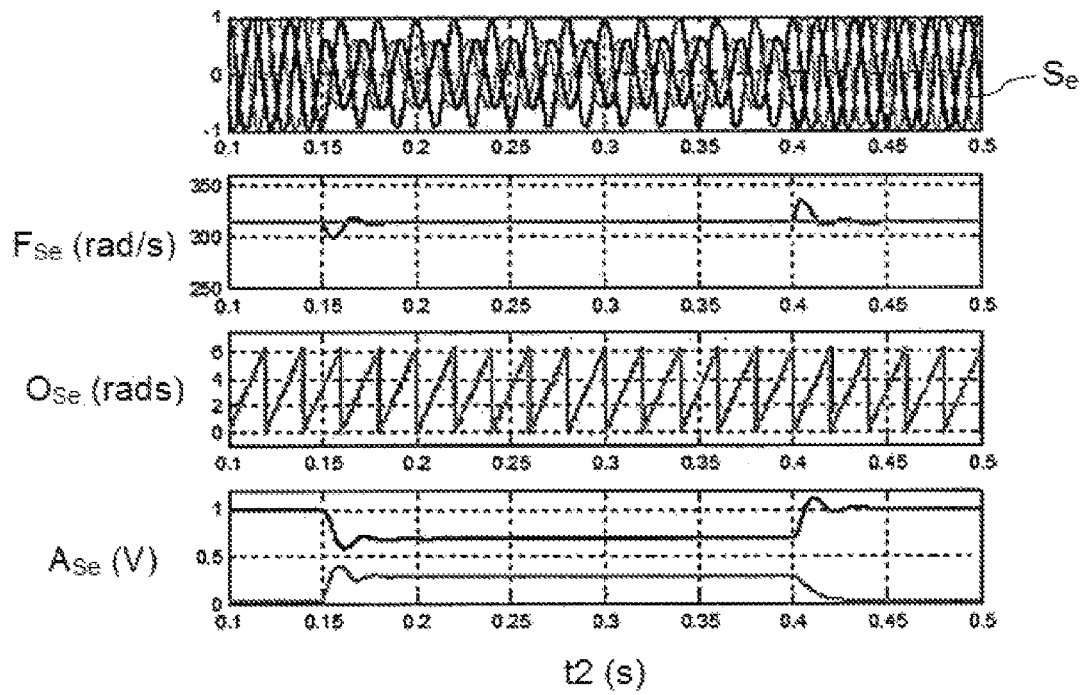
FIG. 8 shows the performance of the synchronization system of FIG. 2 under a sudden change in the amplitude of the main electrical signal.

FIG. 8 shows the performance of the proposed synchronization system 103, in a predetermined interval of time t2, for tracking the amplitude $A_{Se}$, phase angle $O_{Se}$ and frequency $F_{Se}$ of the three phase main electrical signal $S_e$. In this case the estimation of these variables by the synchronization system 103 is shown when there is a sudden change in the amplitude of positive sequence or negative sequence of the main electrical signal $S_e$ at t=0.15 s and t=0.4 s. The main electrical signal $S_e$ is the voltage of a phase off the power system 100. Said FIG. 8 is divided into four plots: (a) Measured main electrical signal $S_e$, (b) Real frequency $F_R$ and estimated frequency $F_S$ of the main electrical signal $S_e$, (c) Real phase angle $O_R$ and estimated phase angle $O_S$ of the main electrical signal $S_e$, and (d) Estimated amplitude $A_S$ of the positive sequence S⁺ and/or the negative sequence S⁻ of the main electrical signals Se.

Figure 9:
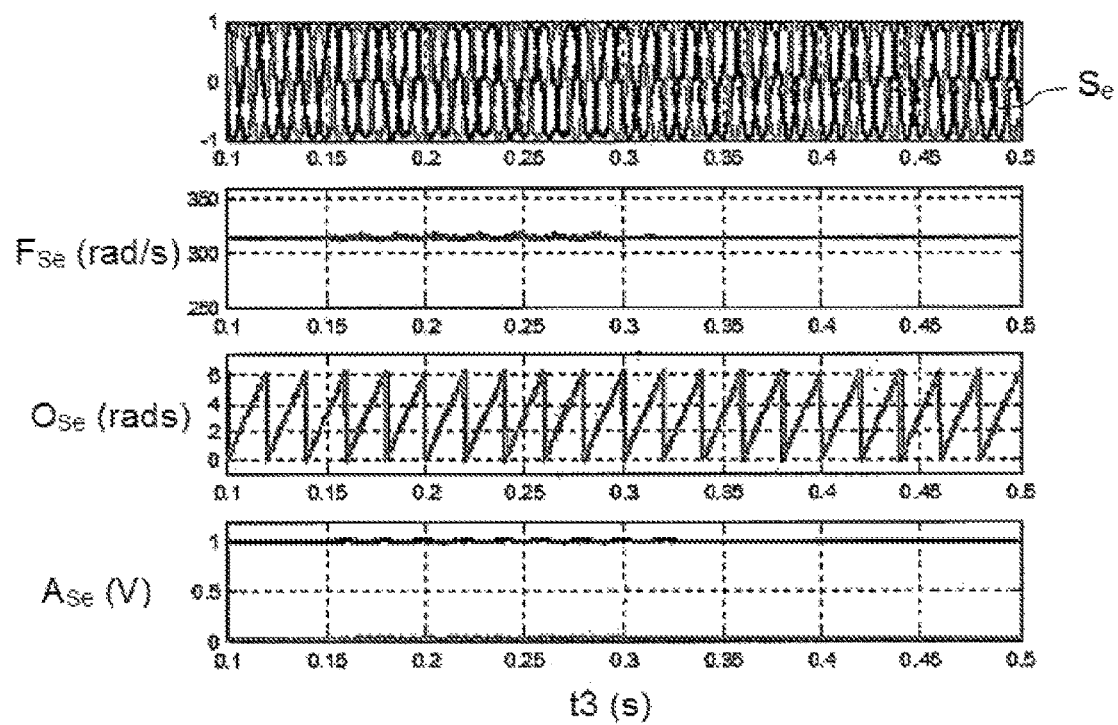
FIG. 9 shows the performance of the synchronization system of FIG. 2 under a 8% of Total Harmonic Distorsion (THD) which is distorting the main electrical signal.

FIG. 9 shows the estimation of the frequency $F_{Se}$, phase angle $O_{Se}$ and amplitude $A_{Se}$ of the three phase main electrical signal $S_e$ by synchronization system 103 when there is a 8% of THD which is distorting said main electrical signal $S_e$, in a predetermined interval of time t3 (between t=0.15 and t=0.3 s). The main electrical signal $S_e$ is the voltage of a phase off the power system 100. Said FIG. 9 is divided into four plots: (a) Measured main electrical signal $S_e$ where the THD increases at t=0.15, (b) Real frequency $F_R$ and estimated frequency $F_S$ of the main electrical signal $S_e$, (c) Real phase angle $O_R$ and estimated phase angle $O_S$ of the main electrical signal $S_e$, and (d) Estimated amplitude $A_S$ of the positive sequence S⁺ and/or the negative sequence S⁻ of the main electrical signal $S_e$. As shown in said FIG. 9, the synchronization system 103 is able to attenuate the harmonics in the estimation of the amplitude and the frequency due to the inherent processing block 5.

Other embodiments refer to a synchronization method for a power generation unit 102 coupled to an electrical power system 100, where at least one synchronization signal $S_s$ is generated by means of at least one Phase-Locked Loop 4, for facilitating the synchronization between the power generation unit 102 and the power system 100. The Phase-Locked Loop 4 comprises a controller scheme, with a plurality of gain parameters $K_{mn}$, to eliminate the deviation of at least one electrical property of the synchronization signal $S_s$ with respect to the main electrical signal $S_e$, the electrical property being selected from at least the amplitude, the frequency and the phase angle. The amplitude and the frequency of the main electrical signal $S_e$ are first estimated, as it has also been explained for the first aspect of the invention. The advantages of using both the amplitude and the frequency (or the phase angle) of the main electrical signal $S_e$ to adjust the gain parameters $K_{mn}$ has also been explained for the first aspect of the invention.

The method, in any of its embodiments, is configured to generate, based on a main electrical signal $S_e$, at least one synchronization signal $S_s$ for facilitating the synchronization between the power generation unit 102 and the grid 100. The main electrical signal $S_e$ may be any of the electrical variables of the corresponding phase, such as the voltage or the current. If the grid 100 is a three-phase power system the main electrical signal $S_e$ can derive from any of the three-phases. If the grid 100 is a single-phase power system the main electrical signal $S_e$ derives, obviously, from the only phase.

In any embodiment of the method the value of the gain parameters $K_{mn}$ of the Phase-Locked Loop 4 are dynamically adjusted depending on the frequency, or phase angle, and the amplitude of the main electrical signal $S_e$. The gain parameters $K_{mn}$ are generated by a gain controller 20, and are subsequently transmitted to the PLL 4. The method can be continuously executed, and not only during a grid fault or other fault, to remain active also in steady state of the power generation unit 102 to more accurately facilitate the synchronization between the grid 100 and the power generation unit 102.

In the preferred embodiment, in order to improve the generation of the synchronization signal $S_s$ during grid transients, and in particular the performance of the PLL 4, fuzzy logic is applied to adjust the gain parameters $K_{mn}$ of the PLL 4 based on the amplitude and the frequency. The advantages of applying fuzzy logic have already been explained for the first aspect of the invention. For applying fuzzy logic the estimated frequency can be used directly (or the estimated phase angle), or a frequency difference $\varepsilon_f$ (or a phase angle difference) can be used instead, as it has also been explained for the first aspect of the invention.

In the method, the deviation of at least one electrical property of the synchronization signal $S_s$ with respect to the main electrical signal $S_e$ is eliminated, the electrical property being selected between, at least, the amplitude, the frequency and the phase angle. For this purpose, a subtraction between the main electrical signal (or an electrical input signal comprising the same amplitude, frequency and phase angle of the main electrical signal $S_e$) and the synchronization signal $S_s$ is made. The explanation given for the generation of the electrical input signal in the first aspect of the invention is also valid for the second aspect of the invention, and, in a preferred embodiment, the method implements a subtraction between the electrical input signal and the synchronization signal $S_s$. In the method, the electrical signal (electrical error signal) resulting from the subtraction is processed by a controller scheme in order to eliminate at least said deviation.

In the preferred embodiment, the electrical error signal is processed in order to eliminate two deviations between the synchronization signal $S_s$ and the main electrical signal $S_e$: the phase angle error and the amplitude error. Said elimination is implemented by two parallel control loops 41 and 42 as explained before for the first aspect of the invention. The output signals of both control loops 41 and 42 are combined by means of an oscillator VCO, the output of said oscillator VCO being the synchronization signal $S_s$.

In the preferred embodiment the method is adapted to estimate the phase angle that would have the main electrical signal $S_e$ depending on power-related signals P and Q and on a grid impedance Z, to calculate the phase angle of the main electrical signal $S_e$, and to obtain a phase angle difference $O_{ff}$ between both the estimated and calculated phase angles. The power-related signals P and Q are representative of the active and reactive power of the grid 100 respectively. The phase angle difference $O_{ff}$ is taken into account for eliminating the phase angle error as it has been explained for the first aspect of the invention.

In the preferred embodiment the method is also adapted to estimate an amplitude difference $A_{ff}$ between the amplitude corresponding to the situation depending on the received power-related signals P and Q and on the grid impedance Z and the estimated amplitude of said electrical input signal. The amplitude difference $A_{ff}$ is taken into account for eliminating the amplitude error as it has been explained for the first aspect of the invention.

In other embodiments of the method, the electrical error signal is processed in order to eliminate only the phase angle error (and not the amplitude error $A_{ff}$), and the phase angle difference $O_{ff}$ is also taken into account for eliminating it.

In other embodiments of the method, the electrical error signal is processed in order to eliminate only the phase angle error (and not the amplitude error $A_{ff}$), and the phase angle difference $O_{ff}$ is not generated (or it is not taken into account for eliminating it).

In other embodiments of the method, the electrical error signal is processed in order to eliminate both the phase angle error and the amplitude error between the synchronization signal $S_s$ and the main electrical signal $S_e$, but the phase angle difference $O_{ff}$ and the amplitude error $A_{ff}$ are not generated (or they are not taken into account for eliminating them).

The power-related signals P and Q are representative, respectively, of the active and reactive power to be delivered to the grid 100 or of the active and reactive power delivered to the grid 100.

The invention claimed is:

1. A synchronization system for a power generation unit coupled to an electrical power system to facilitate the synchronization between the power generation unit and the electrical power system, the synchronization system comprising:
a Phase-Locked Loop comprising at least one controller scheme with a plurality of gain parameters (Kmn), to eliminate a deviation of at least one electrical property of a synchronization signal (Ss) with respect to a main electrical signal (Se) from the electrical power system, the electrical property being selected between at least one of amplitude, frequency and phase angle and the controller scheme comprising at least one controller or regulator with a plurality of gain parameters (Kmn); and
a gain controller configured to adjust a value of the gain parameters (Kmn) of the Phase-Locked Loop depending on the amplitude of said main electrical signal (Se) and at least one of the frequency or phase angle of said main electrical signal (Se),
wherein the electrical power system is a grid, the synchronization system being configured to communicate with the grid and with the power generation unit and to facilitate the synchronization between the power generation unit and the grid.

2. The synchronization system according to claim 1, wherein the gain controller is configured to apply fuzzy logic control to adjust the gain parameters (Kmn), said fuzzy logic control comprising the amplitude and the frequency or the phase angle of the main electrical signal (Se) as inputs.

3. The synchronization system according to claim 1, wherein the Phase-Locked Loop is configured to receive an electrical input signal comprising the main electrical signal (Se) or a signal comprising the same amplitude, phase angle and frequency as the main electrical input signal, said Phase-Locked Loop comprising a control loop configured to eliminate a phase angle error between the synchronization signal (Ss) and the electrical input signal and comprising a controller with the plurality of gain parameters (Kmn), the synchronization system comprising an advanced estimator communicating with the Phase-Locked Loop and configured
to receive a first power-related signal (P) and a second power-related signal (Q) representative of active and reactive power of the electrical power system respectively,
to estimate a phase angle that would have the main electrical signal (Se) depending on the power-related signals (P, Q) and on the grid impedance (Z),
to calculate a phase angle of the main electrical signal (Se),
to estimate a phase angle difference (Off) based on both said estimated and calculated phase angles, and
to transmit said phase angle difference (Off) to the Phase-Locked Loop, so that said Phase-Locked Loop also takes into account said phase angle difference (Off) to generate the synchronization signal (Ss).

4. The synchronization system according to claim 3, wherein the Phase-Locked Loop also comprises a second control loop configured to eliminate an amplitude angle error between the synchronization signal (Ss) and the electrical input signal and comprising a controller with the plurality of gain parameters (Kmn), the first and second control loops are configured to receive a same common electrical input signal resulting from a subtraction between the electrical input signal and the synchronization signal (Ss), the advanced estimator being also configured
to estimate an amplitude difference (Aff) of the main electrical signal (Se) between the amplitude corresponding to the situation depending on the received power-related signals (P, Q) and on the grid impedance (Z), and the estimated amplitude, and
to transmit the estimated amplitude difference (Aff) to the Phase-Locked Loop, so that said Phase-Locked Loop also takes into account said amplitude difference (Aff) to generate the synchronization signal (Ss).

5. The synchronization system according to claim 4, wherein the first and second control loops of the Phase-Locked Loop are connected in parallel, output electrical signals of the first and second control loops are combined in an oscillator, and an output signal of the oscillator is the synchronization signal (Ss).

6. The synchronization system according to claim 1, wherein the Phase-Locked Loop is configured to receive an electrical input signal comprising the main electrical signal (Se) or a signal comprising the same amplitude, phase angle and frequency as the main electrical input signal, said Phase-Locked Loop comprising a first control loop configured to eliminate a phase angle error between the synchronization signal (Ss) and the electrical input signal and comprising a controller with the plurality of gain parameters (Kmn), and a second control loop configured to eliminate an amplitude angle error between the synchronization signal (Ss) and the electrical input signal and comprising a controller with the plurality of gain parameters (Kmn), the first and second control loops configured to each receive a common electrical input signal resulting from a subtraction between the electrical input signal and the synchronization signal (Ss).

7. The synchronization system according to claim 1, further comprising a processing block configured to receive and process the main electrical signal (Se) to obtain at least one of a positive and negative sequence (S+, S−) of the main electrical signal (Se), said at least one of the positive sequence (S+) and the negative sequence (S−) being an electrical input signal to be received by the Phase-Locked Loop.

8. The synchronization system according to claim 7, wherein the processing block comprises
   a first block to transform the main electrical signal (Se) into alpha-beta components,
   a high pass filter configured to cancel the effects of DC components present in the alpha-beta components, and
   a sequence estimator for obtaining one of the positive sequence (S+) and the negative sequence (S−) of the main electrical signal (Se).

9. A synchronization method for a power generation unit coupled to an electrical power system, comprising:
   generating, with a Phase-Locked Loop, at least one synchronization signal (Ss) for facilitating synchronization between the power generation unit and the power system, the Phase-Locked Loop comprising a controller scheme, with at least one controller or regulator comprising a plurality of gain parameters (Kmn);
   eliminating a deviation of at least one electrical property of the synchronization signal (Ss) with respect to a main electrical signal (Se), the electrical properties being at least the amplitude, frequency and phase angle; and
   dynamically adjusting a value of the plurality of gain parameters (Kmn) of the Phase-Locked Loop depending on the amplitude of the main electrical signal (Se) and one of the frequency or phase angle of the main electrical signal (Se),
   wherein the electrical power system is a grid.

10. The synchronization method according to claim 9, wherein fuzzy logic control is applied to adjust the gain parameters (Kmn) based on the amplitude and on the frequency or phase angle.

11. The synchronization method according to claim 9, wherein a deviation of the phase angle between the synchronization signal (Ss) and the main electrical signal (Se) is eliminated by a controller with the plurality of gain parameters (Kmn) that are dynamically adjusted, and
   estimating a first phase angle that would have the main electrical signal (Se) depending on two power-related signals (P, Q) representative of active and reactive power of the electrical power system and on the grid impedance (Z),
   estimating a second phase angle of the main electrical signal (Se),
   estimating a phase angle difference (Off) between the first and second estimated phase angles, and
   using said phase angle difference (Off) to eliminate said deviation of the phase angle between the synchronization signal (Ss) and the main electrical signal (Se).

12. The synchronization method according to claim 11, further comprising eliminating a deviation in amplitude between the synchronization signal (Ss) and the main electrical signal (Se) by using a second controller with the plurality of gain parameters (Kmn) that are dynamically adjusted, said second controller configured in parallel with the controller that eliminates the deviation of the phase angle, and
   estimating a first amplitude that would have the main electrical signal (Se) depending on two power-related signals (P, Q) representative of active and reactive power of the electrical power system and on the grid impedance (Z),
   estimating a second amplitude of the main electrical signal (Se),
   estimating an amplitude difference (Aff) between the first and second estimated amplitudes, and
   using said amplitude difference (Aff) to eliminate said deviation of the amplitude between the synchronization signal (Ss) and the main electrical signal (Se).

13. The synchronization method according to claim 9, further comprising eliminating the deviations of the amplitude and of the phase angle between the synchronization signal (Ss) and the main electrical signal (Se) by using two parallel and respective control loops, each control loop comprising at least one controller, combining output signals of the two control loops by an oscillator (VCO) and an output signal of the oscillator (VCO) is the synchronization signal (Ss).

14. The synchronization method according to claim 9, wherein the main electrical signal (Se) is firstly processed in order to obtain at least one of a positive and a negative sequence (S+, S−) of the main electrical signal (Se), said at least one of the positive sequence (S+) and the negative sequence (S−) being an electrical input signal to be received by the Phase-Locked Loop, at least one deviation being eliminated between the electrical input signal and the synchronization signal (Ss).

15. The synchronization method according to claim 14, wherein to obtain the electrical input signal the main electrical signal ($S_e$) is firstly transformed into alpha-beta components, said components are then caused to pass through a high pass filter for cancelling out effects of DC components, and, after passing through the high pass filter, said components are caused to pass through at least one sequence estimator for obtaining said at least one of the positive sequence ($S^+$) and the negative sequence ($S^-$) of the main electrical signal ($S_e$), the electrical input signal being one of the positive sequence ($S^+$) or negative sequence ($S^-$).

* * * * *